United States Patent
Lee et al.

(10) Patent No.: US 7,943,562 B2
(45) Date of Patent: May 17, 2011

(54) SEMICONDUCTOR SUBSTRATE CLEANING METHODS, AND METHODS OF MANUFACTURE USING SAME

(75) Inventors: Da-Hee Lee, Pyeongtaek-si (KR); Jung-Dae Park, Suwon-si (KR); Hun-Jung Yi, Suwon-si (KR); Tae-Hyo Choi, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 232 days.

(21) Appl. No.: 12/332,568

(22) Filed: Dec. 11, 2008

(65) Prior Publication Data

US 2009/0093107 A1    Apr. 9, 2009

Related U.S. Application Data

(63) Continuation-in-part of application No. 11/454,829, filed on Jun. 19, 2006, now abandoned.

(30) Foreign Application Priority Data

Dec. 11, 2007    (KR) .................. 10-2007-0128340

(51) Int. Cl.
  *C11D 7/32* (2006.01)
(52) U.S. Cl. .................. 510/175; 134/1.3; 252/79.1
(58) Field of Classification Search .................. 510/175; 134/1.3; 252/79.1
  See application file for complete search history.

(56) References Cited

U.S. PATENT DOCUMENTS

| | | | |
|---|---|---|---|
| 5,320,709 A | 6/1994 | Bowden et al. | |
| 5,698,503 A | 12/1997 | Ward et al. | |
| 6,191,086 B1 | 2/2001 | Leon et al. | |
| 2003/0181342 A1* | 9/2003 | Seijo et al. | 510/175 |
| 2006/0172906 A1* | 8/2006 | Wu et al. | 510/175 |

FOREIGN PATENT DOCUMENTS

| | | |
|---|---|---|
| JP | 10055993 A | 2/1998 |
| KR | 1019980070026 A | 10/1998 |
| KR | 1020010034677 A | 4/2001 |
| KR | 1020030022273 A | 3/2003 |
| KR | 1020040074611 A | 8/2004 |
| KR | 1020050025316 A | 3/2005 |

* cited by examiner

*Primary Examiner* — Gregory E Webb
(74) *Attorney, Agent, or Firm* — Volentine & Whitt, PLLC

(57) ABSTRACT

In a cleaning composition, a method of cleaning a semiconductor substrate and a method of manufacturing a semiconductor device, the cleaning composition includes about 0.5 to about 5% by weight of an organic ammonium hydroxide compound, about 0.1 to about 3% by weight of a fluoride compound, about 0.1 to about 3% by weight of a buffering agent, about 0.5 to about 5% by weight of an etching accelerant, and a remainder of water.

20 Claims, 8 Drawing Sheets

SEMICONDUCTOR SUBSTRATE CLEANING METHODS, AND METHODS OF MANUFACTURE USING SAME

CROSS-REFERENCE TO RELATED APPLICATIONS

This application is a Continuation-In-Part (CIP) of U.S. patent application Ser. No. 11/454,829, entitled "CLEANING COMPOSITION AND RELATED METHODS," filed on Jun. 19, 2006. This application also claims priority under 35 USC §119 to Korean Patent Application No. 2007-128340, filed on Dec. 11, 2007, the subject matter of which is hereby incorporated by reference.

BACKGROUND

Example embodiments relate generally to cleaning compositions, related cleaning methods for a semiconductor substrate, and methods of manufacturing a semiconductor device using same. More particularly, Example embodiments relate to cleaning compositions removing impurities from a semiconductor substrate having a metal structure in a single-wafer cleaning process, related methods of cleaning a semiconductor substrate and methods of manufacturing a semiconductor device using same.

The fabrication of semiconductor devices on a semiconductor substrate routinely involves the deposition of conductive material layers, as well as their patterning and etching. The resulting "conductive elements" (e.g., signal lines and other wiring, electrode structures, etc.) are used to conduct electricity between various circuits. Accordingly, metal and metal alloys (e.g., tungsten, aluminum, etc., and collectively referred to as "metal") are used.

A conductive element may be formed from a constituent material layer using a dry etching process to partially remove a conductive layer using a photoresist pattern as an etching mask, along with an ashing process and/or a stripping process to remove the photoresist pattern. When the conductive element is formed on a substrate using a dry etching, ashing, and/or stripping processes, however, impurities remain on the conductive element and/or the underlying substrate or associated material layer(s). Examples of such residual impurities include etching residues, organic residues, oxide residues, metallic residues and combinations thereof. These residual impurities may alter the electrical resistance of a semiconductor device incorporating the conductive element, or generate an electrical short between adjacent conductive elements. Thus, a cleaning composition capable of removing residual impurities from conductive elements and/or the substrate is required in order to ensure the reliability of the semiconductor device.

Conventional cleaning solutions such as APM (standard cleaning solution, SC-1) or SPM (sulfuric acid stripper) may corrode certain types of metal (e.g., tungsten) when used in a cleaning process to remove residual impurities. Thus, conventional cleaning solutions may not be used to clean a substrate having exposed metal element(s).

Substrates having exposed metal elements are conventionally cleaned using an organic stripper comprising an organic solvent. The organic stripper does not severely corrode the exposed metal, but it may fail to adequately remove residual impurities from the metal elements and/or the substrate.

During a cleaning process, residual impurities may actually be dispersed through the applied cleaning composition as suspended particles. Further, a portion of the metallic residual impurities may dissolve in the cleaning composition and form metal ions. As the number of semiconductor substrates (or wafers) to-be-cleaned during a cleaning process increases, so too does the overall duration of the cleaning process. As the duration of an applied cleaning process increases, the quantity of suspended (and potentially contaminating) particles and/or dissolved metal ions in the cleaning composition also increases. Suspended particles and dissolved metal ions may then be transferred from one wafer to another during a batch cleaning process. At a minimum, such contaminated wafers require re-cleaning and thus reduce the productivity of the overall semiconductor fabrication process. Worse yet, contaminated wafers make yield inoperable or impaired semiconductor devices.

Newer conventional organic cleaning compositions exhibiting improved effectiveness have been developed. However, organic cleaning compositions, while rapidly removing organic impurities (e.g., photoresist residue) exhibit relatively poor performance in removing fine particles and/or residual metallic impurities. Many related conventional cleaning processes for removing impurities must be performed by immersing a plurality of wafers into a bath for some time period. In such cleaning processes, fine particles or metallic impurities readily disperse in the bath and may contaminate the wafers. Additionally, organic cleaning compositions may include volatile organic components that contaminate a working space in a semiconductor fabrication facility.

SUMMARY

Examples embodiments provide cleaning compositions that effectively remove residual impurities, such as fine metal particles, from a semiconductor substrate in a single-wafer cleaning process. Examples embodiments also provide cleaning methods for removing residual impurities from a substrate using a cleaning composition according to example embodiments. Example embodiments also provide methods of manufacturing for a semiconductor device wherein a cleaning composition or cleaning method according to example embodiments are used.

In one embodiment, there is provided a cleaning composition removing residual impurities from a semiconductor substrate having a conductive element previously formed thereon in a single-wafer cleaning process. The composition comprises about 0.5 to about 5% by weight of an organic ammonium hydroxide compound, about 0.1 to about 3% by weight of a fluoride compound, about 0.1 to about 3% by weight of a buffering agent, about 0.5 to about 5% by weight of an etching accelerant, and a remainder of water.

In another embodiment, there is provided a method of cleaning a semiconductor substrate, comprising; preparing a cleaning composition to include about 0.5 to about 5% by weight of an organic ammonium hydroxide compound, about 0.1 to about 3% by weight of a fluoride compound, about 0.1 to about 3% by weight of a buffering agent, about 0.5 to about 5% by weight of an etching accelerant, and a remainder of water, and thereafter applying the cleaning composition to a semiconductor substrate having a conductive element previously formed thereon using a single-wafer cleaning process.

In another embodiment, there is provided a method of manufacturing a semiconductor device, comprising; forming a conductive element from a metal material on a substrate;, and thereafter removing residual impurities from the substrate and the conductive element using a single-wafer cleaning process and a cleaning composition that comprises about 0.5 to about 5% by weight of an organic ammonium hydroxide compound, about 0.1 to about 3% by weight of a fluoride compound, about 0.1 to about 3% by weight of a buffering agent, about 0.5 to about 5% by weight of an etching accelerant, and a remainder of water, the impurities being generated while the conductive element is formed on the substrate.

BRIEF DESCRIPTION OF THE DRAWINGS

Example embodiments will be more clearly understood from the following detailed description taken in conjunction with the accompanying drawings.

FIG. 1 is a flow chart summarizing a method of cleaning a semiconductor substrate using a cleaning composition according to example embodiments;

FIGS. 2-5 are cross-sectional views illustrating a method of forming a word line on a semiconductor substrate using a cleaning composition according to example embodiments; and FIGS. 6-11 are cross-sectional views illustrating a method of forming a bit line on a semiconductor substrate using a cleaning composition according to example embodiments.

DESCRIPTION OF EXAMPLE EMBODIMENTS

Figure 1:
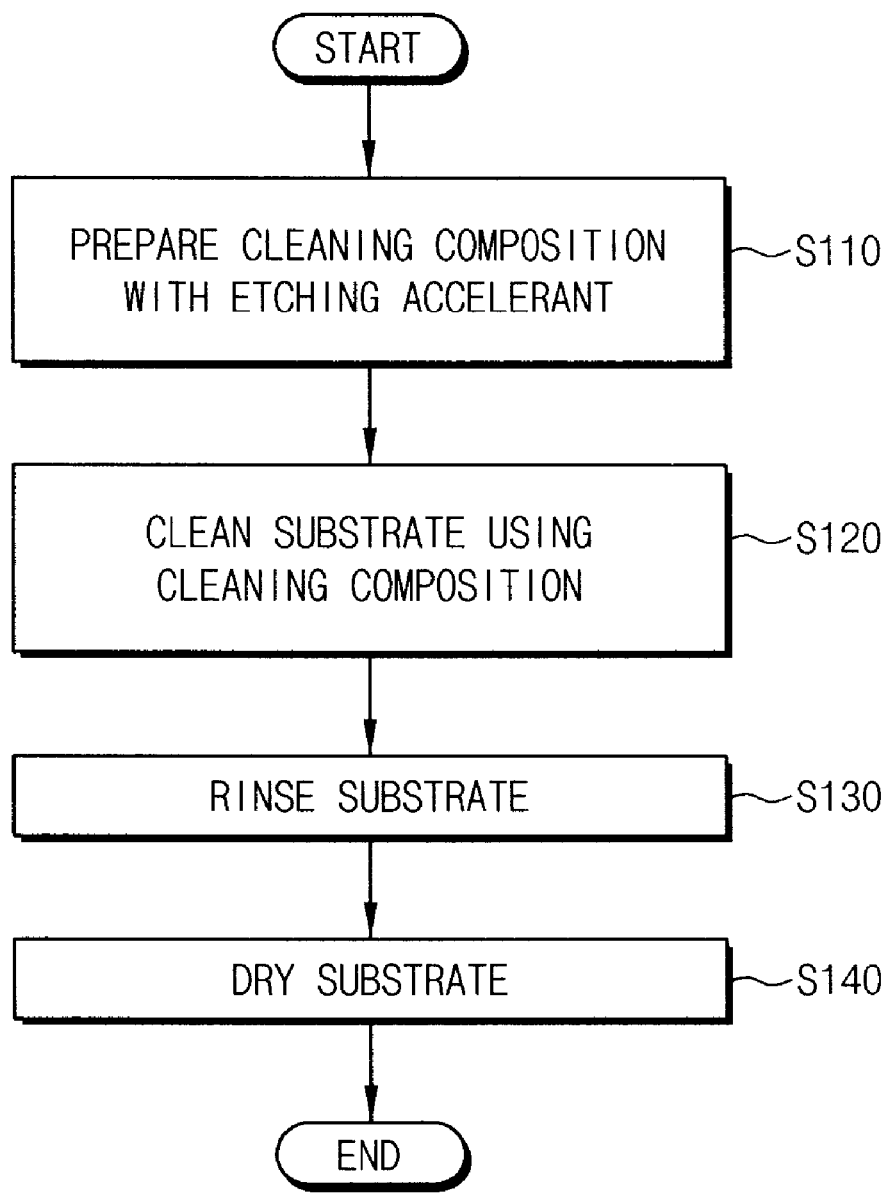
FIGS. 1-11 represent non-limiting, example embodiments as described herein.

Various example embodiments will now be described in some additional detail with reference to the accompanying drawings. Embodiments may, however, be embodied in many different forms and should not be construed as being limited to only the illustrated embodiments. Rather, the embodiments are presented as teaching examples. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

A cleaning composition according to embodiments may be employed in a single-wafer cleaning process. In the single-wafer cleaning process, the cleaning composition is able to rapidly remove residual impurities formed by dry etching process. The cleaning compositions according to embodiments are also able to suppress damage to an exposed oxide layer and/or an exposed conductive layer. Further, cleaning compositions and cleaning methods according to embodiments prevent re-contamination of a substrate by suspended fine particles and dissolved impurities.

In certain embodiments, a cleaning composition comprises an organic ammonium hydroxide compound, a fluoride compound, a buffering agent, an etching accelerant and water. In certain related embodiments, the cleaning composition may additionally comprise a surfactant.

The organic ammonium hydroxide compound and the fluoride compound remove impurities from a substrate and any exposed conductive elements, and also suppress re-contamination of the substrate by suspended particles. The organic ammonium hydroxide compound readily removes organic impurities, oxide impurities and/or fine metallic impurities. Further, the organic ammonium hydroxide compound inhibits impurities from being re-adsorbed (or precipitated) onto the cleaned surface of the working substrate, and also easily remove re-adsorbed particles from the substrate and/or exposed conductive elements.

When the amount of the organic ammonium hydroxide compound is less than about 0.5% by weight, the cleaning composition exhibits reduced abilities of removing impurities and particles. When the amount of the organic ammonium hydroxide is greater than about 5% by weight, corrosion of exposed conductive elements (e.g., elements formed from tungsten or aluminum) may occur. Therefore, in certain embodiments, a cleaning composition comprises an organic ammonium hydroxide compound in a range of from about 0.5 to about 5% by weight. In other embodiments, the amount of the organic ammonium hydroxide compound varies in a range of from about 0.5 to about 3% by weight.

Non-limiting examples of the organic ammonium hydroxide include tetramethylammonium hydroxide, tetraethylammonium hydroxide, tetrapropylammonium hydroxide, tetrabutylammonium hydroxide, tetrahexylammonium hydroxide, tetraoctylammonium hydroxide, benzyltriethylammonium hydroxide, diethyldimethylammonium hydroxide, hexadecyltrimethylammonium hydroxide, methyltributylammonium hydroxide and the like. These may be used alone or in a combination thereof.

The fluoride compound contained in certain embodiments serves to remove oxide impurities, but may corrode a conductive element in greater concentrations. When the amount of the fluoride compound is less than about 0.1% by weight, the ability of the cleaning composition to remove oxide impurities or fine particles deteriorates. When the amount of the fluoride compound is greater than about 3% by weight, an exposed oxide layer and/or an exposed conductive layer may be corroded or damaged. In some embodiments, the amount of the fluoride compound varies a range of about 0.1 to about 3% by weight. In other embodiments, the amount of the fluoride compound varies in a range of about 0.1 to about 1% by weight, and in still other embodiments, varies in a range of about 0.1 to about 0.25% by weight.

Non-limiting examples of the fluoride compound may include hydrogen fluoride, tetramethylammonium fluoride, tetraethylammonium fluoride, tetrapropylammonium fluoride, tetrabutylammonium fluoride, fluoroboric acid, tetramethylammonium tetrafluoroborate, tetraethylammonium tetrafluoroborate, tetrapropylammonium tetrafluoroborate, tetrabutylammonium tetrafluoroborate or combinations thereof.

One or more buffering agent(s) may be used to maintain the cleaning composition's ability to remove impurities and reduce recontamination caused by particles or a metal, even though a pH of the cleaning composition varies. When the cleaning composition is reused, the pH of the cleaning composition may become altered. The buffering agent will stabilize the pH of the cleaning composition to maintain the cleaning composition's ability to remove impurities.

Additionally, the buffering agent may contribute to inhibiting particle contamination and metallic contamination that may be affected by a pH variation. The buffering agent may electrically charge surfaces of the particles to prevent the particles from being re-adsorbed to a substrate and/or a conductive element. Considering the zeta potential of the particles, a basic cleaning solution may prevent the particles from being re-adsorbed, whereas the basic cleaning solution may not effectively remove metallic impurities. An acidic cleaning solution may readily remove the metallic impurities, but may not sufficiently inhibit the particles from being re-adsorbed.

In certain embodiments, the cleaning composition may be adapted to remove fine particles and/or metallic impurities in a single-wafer cleaning process, and thus the cleaning composition may have an acidic pH level. In some embodiments, the pH of the cleaning composition varies from about 2.0 to about 4.5, and in other embodiments, the pH level varies from about 3.5 to about 4.5. In such an acidic pH level, the cleaning composition may have an improved ability to remove impurities, and also a reduced etching rate of a metal layer (e.g., a tungsten layer). Further, the buffering agent may properly adjust the zeta potential of the particles in accordance with a variation of the pH to prevent the particles and the metallic impurities from being re-adsorbed.

When the amount of the buffering agent is less than about 0.1% by weight, the cleaning composition's ability to remove the polymer and the particles may not be stable. When the amount of the buffering agent is greater than about 3% by weight, the buffering agent's abilities to maintain the stability of the cleaning composition and to prevent contamination of particles may not greatly increase, and the pH of the cleaning may excessively vary due to the acidity of the buffering agent itself. Therefore, in certain embodiments, the cleaning composition comprises a buffering agent in a range of about 0.1 to about 3% by weight. In other embodiments, the amount of buffering agent varies in a range of about 0.4 to about 1.5% by weight.

A non-limiting example of the buffering agent may include an inorganic ammonium salt which may include, for example, ammonium nitrate, ammonium iodate or a combination thereof.

In certain embodiments, the cleaning composition may include one or more etching accelerant(s), (hereafter an "etching accelerant"), which improves the etching selectivity of the composition as between a conductive layer (e.g., a metal layer) and an exposed oxide layer. The etching accelerant suppresses the etching of the oxide layer, while allowing very fine and accurately applied etching effects to the metal layer. The etching accelerant may also enhance the cleaning composition's ability to remove fine metal particles and/or metal ions.

When the amount of the etching accelerant is less than about 0.5% by weight, the cleaning composition's ability to remove fine particles is reduced. When the amount of the etching accelerant is greater than about 5% by weight, the cleaning composition readily removes impurities from a substrate, but may excessively etch an exposed conductive element. In certain embodiments, the amount of the etching accelerant varies in a range from about 0.5 to about 5% by weight. In other embodiments, the amount of etching accelerant varies in a range from about 0.5 to about 2% by weight.

Non-limiting examples of the etching accelerant may include ammonium fluoride ($NH_4F$), ammonium bromide ($NH_4Br$), ammonium sulfate (($NH_4$)$_2SO_4$) or combinations thereof. For example, the ammonium fluoride may effectively remove impurities from a substrate and/or a conductive element, and also finely etch a conductive element with a reduced etching amount.

In certain embodiments, the cleaning composition may further comprise a surfactant. The surfactant inhibits impurities from adhering to surfaces of a substrate and/or a conductive element, and also prevents the conductive element from being etched or damaged by the cleaning composition. In one embodiment, the surfactant is a nonionic surfactant.

When the amount of the surfactant is less than about 5 ppm, the cleaning composition's ability to inhibit recontamination of impurities and/or to reduce damage to the conductive element is not substantially improved. However, when the amount of the surfactant is greater than about 100 ppm, the surfactant may remain or adhere to the substrate and a defect within the resulting semiconductor device. Therefore, in certain embodiments, the amount of the surfactant varies in a range of about 5 to about 100 ppm. In other embodiments, the amount of the surfactant varies in a range of about 5 to about 30 ppm.

Non-limiting examples of the surfactant may include NCW-1002, which is a trade name for a product manufactured by Wako Co., of Japan, a block copolymer of polyethylene glycol and polypropylene glycol, etc. Non-limiting examples of the block copolymer of polyethylene glycol and polypropylene glycol may include Synperonic PE/F68, Synperonic PE/L61, Synperonic PE/L64, all trade names for products manufactured by Fluka Co., of Germany, etc.

In certain embodiments, the cleaning composition has a pH level in a range of about 2 to about 4.5. When the pH of the cleaning composition is lower than about 2, contamination induced by particles may occur. However, when the pH of the cleaning composition is higher than about 4.5, exposed conductive elements (e.g., elements formed from aluminum or tungsten) may be damaged. In other embodiments, the pH level varies in a range of from about 2.5 to about 4.5. In still other embodiments, the pH level varies in a range of between about 3.5 to about 4.5. In yet other embodiments, the pH level varies in a range of between about 3.5 to about 4.0.

In a method of preparing a cleaning composition according to an embodiment, an organic ammonium hydroxide and a fluoride compound is dissolved in water to prepare an organic ammonium fluoride aqueous solution. The amount of the organic ammonium hydroxide may vary in a range of about 0.5 to about 5% by weight, based on a total weight of the cleaning composition finally obtained. The amount of the fluoride compound may vary in a range of about 0.1 to about 3% by weight.

A buffering agent and an etching accelerant may be added to the organic ammonium fluoride aqueous solution to prepare a cleaning composition. The amount of the buffering agent may vary in a range of 0.1 to about 3% by weight, based on a total weight of the cleaning composition. Additionally, the amount of the etching accelerant may be in a range of about 0.5 to about 5% by weight. The organic ammonium hydroxide, the fluoride compound, water, the buffering agent and the etching accelerant are previously described, so any further explanations in these regards will be omitted herein. In some embodiments, the cleaning composition may include a non-ionic surfactant in a range of about 5 to about 100 ppm.

The cleaning composition may be prepared using a stirrer or a circulation system. The cleaning composition may have a pH of about 2.0 to about 4.5 in some embodiments, or a pH of about 2.5 to about 4.0 in other embodiments.

FIG. (FIG.) 1 is a flow chart summarizing an exemplary method of cleaning a semiconductor substrate using cleaning compositions in accordance with an embodiment. Referring to FIG. 1, a cleaning composition in accordance with an embodiment, which may include an organic ammonium hydroxide, a fluoride compound, a buffering agent, an etching accelerant and water is prepared (S110).

In certain embodiments, the cleaning composition may be prepared to include the organic ammonium hydroxide of about 0.5 to about 5% by weight, the fluoride compound of about 0.1 to about 3% by weight, the buffering agent of about 0.1 to about 3% by weight, the etching accelerant of about 0.5 to about 5% by weight and a remainder of water. In other embodiments, the cleaning composition may be prepared to further include a non-ionic surfactant in a range of about 5 to about 100 ppm. In still other embodiments, the cleaning composition may include the organic ammonium hydroxide of about 0.5 to about 3% by weight, the fluoride compound of about 0.1 to about 1% by weight, the buffering agent of about 0.4 to about 1.5% by weight, the etching accelerant of about 0.5 to about 2% by weight, the non-ionic surfactant of about 5 to about 50 ppm and a remainder of water. The cleaning composition and the method of preparing the cleaning composition are previously described, so any further explanations in these regards will be omitted herein.

The cleaning composition is then applied to a substrate on which a conductive element has previously been formed, along with resulting residual impurities (S120). Accordingly, the residual impurities are removed from the substrate and/or the exposed conductive element.

Non-limiting examples of the conductive element include a gate electrode, a bit line electrode, a wiring, a pad, a contact, a plug, etc. The conductive element may include a conductive layer pattern. The conductive layer pattern may be formed using a conductive material such as a metal, a conductive metal nitride, a metal silicide, polysilicon doped with impurities, etc. The metal may be, for example, tungsten, titanium, aluminum, cobalt, copper, tantalum, etc. The conductive metal nitride may be, for example, titanium aluminum nitride, aluminum nitride, titanium nitride, titanium silicon nitride, tantalum nitride, tantalum silicon nitride, tungsten nitride, etc. The metal suicide may be, for example, tungsten silicide, titanium silicide, cobalt silicide, etc. The impurities may be, for example, oxide impurities, organic impurities having carbon, metal impurities, etc. In some embodiments, an oxide layer pattern may also be formed on the substrate.

In certain embodiments, the cleaning composition is applied to the substrate using a single-wafer cleaning apparatus. For example, the cleaning composition may be applied to the substrate using a spin spray-type cleaning apparatus or a spin-type cleaning apparatus. The cleaning process may be carried out by providing the substrate with the cleaning composition while the substrate may rotate at a speed of about 1,000 to about 2,000 rpm.

When the cleaning composition applied to the substrate has a temperature less than about 10° C., the cleaning time required to remove residual impurities may be longer than it would be if the temperature were greater than about 10° C. However, when the temperature of the cleaning composition is greater than about 50° C., the residual impurities are effectively removed, but the conductive element or associated oxide layer pattern may be damaged in the process. Thus, in certain embodiments, the cleaning composition should be applied to the substrate at a temperature in a range of from about 10° C. to about 50° C. In other embodiments, the temperature of the cleaning composition may vary between about 20 to about 30° C.

The cleaning time may be adjusted in accordance with the temperature of the cleaning composition. For example, when the temperature of the cleaning composition is room temperature, the cleaning composition may be applied to the substrate for about 30 to 90 seconds.

After the cleaning composition is applied to the substrate, the substrate rinsed (S130). Accordingly, any remaining impurities, particles, metal ions and the cleaning composition are removed from the substrate and/or the conductive element. The rinsing process may be performed using purified water.

While the cleaning composition is applied to the substrate, residual impurities may remain on the substrate and/or the conductive element and become dissolved in the cleaning composition or may be weakly adsorbed onto the substrate and/or an exposed conductive element. When the substrate is rinsed using pure water, most of the remaining impurities will be removed from the substrate and/or the conductive element. Simultaneously, any remaining portion of the cleaning composition will be removed from the substrate and/or the conductive element.

The substrate is dried to remove any remaining pure water (S140).

When the substrate is cleaned using a cleaning composition in accordance with an embodiment, residual impurities may be effectively removed from the substrate and/or the conductive element without damaging exposed conductive layer(s) and/or the associated oxide layer(s).

A method of manufacturing a semiconductor device using a cleaning composition in accordance with an embodiment will be described with reference to the accompanying drawings.

FIGS. 2 to 5 are cross-sectional views illustrating a method of forming a word line in a semiconductor device using the cleaning composition in accordance with an example embodiment of the present invention.

Figure 2:
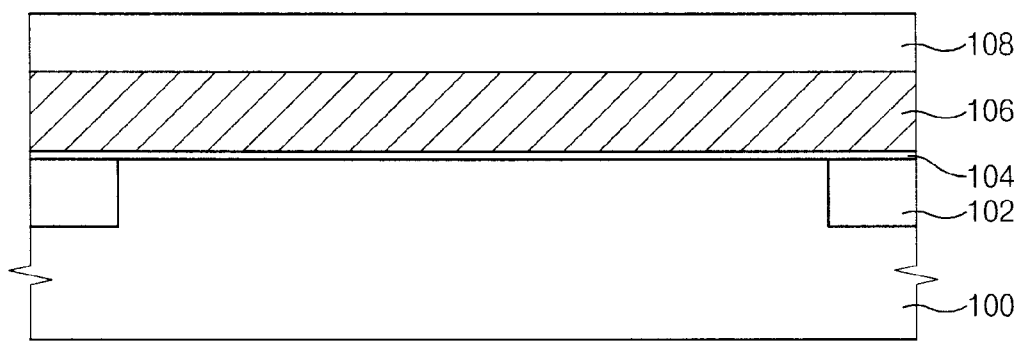

FIG. 2 is a cross-sectional view illustrating forming an isolation layer 102, an oxide layer 104, a conductive layer 106 and a mask layer 108 on a substrate 100. Referring to FIG. 2, the oxide layer 104, the conductive layer 106 and the mask layer 108 are successively formed on the substrate 100 on which the isolation layer 102 is formed. The isolation layer 102 is formed at an upper portion of the substrate 100 to define an active region and a field region. Examples of the substrate 100 include a silicon wafer or a silicon-on-insulator (SOI) substrate. The isolation layer 102 may be formed using a shallow trench isolation (STI) process.

The oxide layer 104 is formed on the substrate 100. The oxide layer 104 is formed by an oxidation process such as a thermal oxidation process or a plasma oxidation process. For example, the oxide layer 104 may be formed using a rapid thermal oxidation process or a furnace thermal oxidation process.

The conductive layer 106 is formed on the oxide layer 104. The conductive layer 106 may be formed using a conductive material such as metal, metal nitride, polysilicon doped with impurities, metal silicide, etc. The conductive layer 106 may be formed using a sputtering process, an atomic layer deposition (ALD) process or a CVD process. The mask layer 108 is then formed on the conductive layer 106. The mask layer 108 may be formed using a material that has an etching selectivity relative to an insulating interlayer successively formed. For example, when the insulating interlayer is formed using oxide, the mask layer 108 may be formed using a nitride such as silicon nitride.

Figure 3:
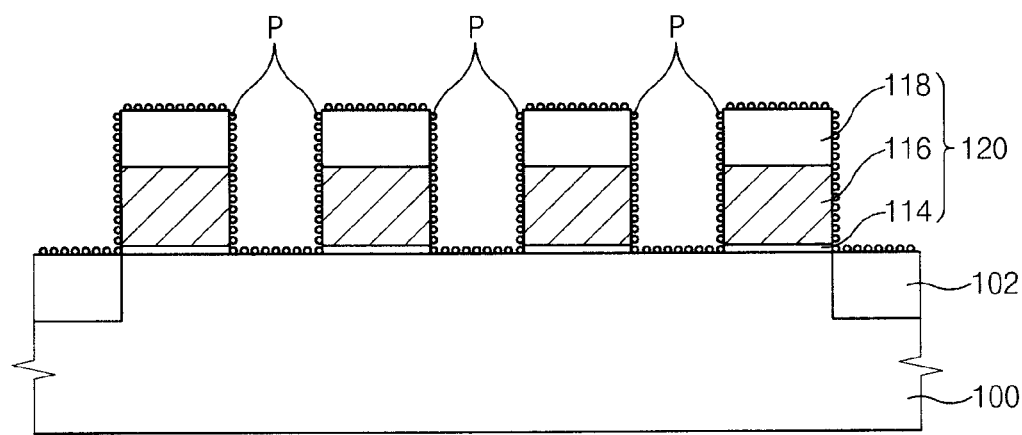

FIG. 3 is a cross-sectional view illustrating forming a gate structure 120 by an etching process. Referring to FIG. 3, the mask layer 108, the conductive layer 106 and the oxide layer 104 are sequentially etched to form the gate structure 120 including an oxide layer pattern 114, a conductive layer pattern 116 and a mask pattern 118 on the substrate 100. The gate structure 120 may correspond to the word line of a semiconductor device.

A photoresist pattern (not shown) may be formed on the mask layer 108. The mask layer 108, the conductive layer 106 and the oxide layer 104 may then be sequentially dry etched using the photoresist pattern as an etching mask to form the gate structure 120 on the substrate 100. In the etching process, the mask layer 108 may be patterned to form the mask pattern 118, the conductive layer 106 may be patterned to form the conductive layer pattern 116, and the oxide layer 104 may be patterned to form the oxide layer pattern 114.

After performing the etching process, a quantity of residual impurities (P) typically remain on the substrate 100 and the gate structure 120. Examples of the residual impurities (P) include etching residues generated during the dry etching process, organic residues generated from the photoresist pattern, metallic residues generated from the conductive layer 106 and/or oxide residues generated from the oxide layer 104. That is, the residual impurities (P) may include organic impurities, metallic impurities and/or oxide impurities.

Figure 4:
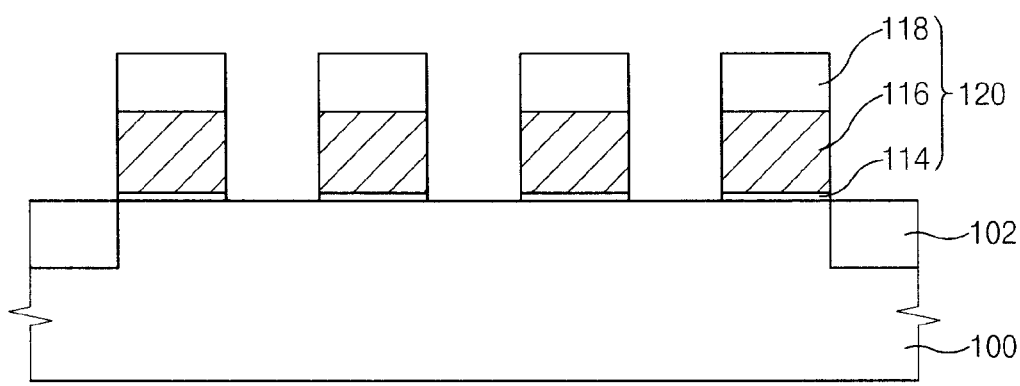

FIG. 4 is a cross-sectional view illustrating the removal of the residual (P) from the substrate 100 and the gate structure 120. Referring to FIG. 4, the residual impurities (P) are removed from the substrate 100 and/or the gate structure 120 by application of a cleaning process according to an embodiment that does not damage the conductive layer pattern 116 or the oxide layer pattern 114.

The cleaning process may be performed by applying a cleaning composition according to an embodiment as described above. The cleaning composition may include about 0.5 to about 5% by weight of an organic ammonium hydroxide, about 0.1 to about 3% by weight of a fluoride compound, about 0.1 to about 3% by weight of a buffering agent, about 0.5 to about 5% by weight of an etching accelerant and a remainder of water. The cleaning composition may further include about 5 to about 100 ppm of a non-ionic surfactant. The cleaning composition and preparation thereof are previously described, so any further explanations will be omitted herein. The impurities (P) may be removed from the substrate 100 and/or the gate structure 120 using the cleaning composition without damages to the conductive layer pattern 116 and/or the oxide layer pattern 114. The cleaning process may be performed using a single-wafer cleaning apparatus.

In an example embodiment, the substrate 100 on which the gate structure 120 is formed may be introduced into the single-wafer cleaning apparatus. A cleaning composition having a temperature of about 10° C. to about 50° C. is applied to the substrate 100. While the substrate 100 rotates at a speed of about 1,000 to about 2,000 rpm, the cleaning composition is provided to the substrate 100 to remove the residual impurities (P) from the substrate 100 and/or the gate structure 120. The cleaning composition may make contact with the substrate 100 for about 30 to about 90 seconds in some embodiments, or for about 40 to about 80 seconds in other embodiments.

The substrate 100 may thereafter be rinsed using pure water (e.g. deionized water). Accordingly, the residual impurities (P), particles and the cleaning composition may be removed from the substrate 100. After the cleaning composition is applied to the substrate 100, the residual impurities (P) are dissolved into the cleaning composition or may be weakly adsorbed onto the substrate 100 and the gate structure 120. When the substrate 100 is rinsed using pure water, most of the remaining polymer may be removed from the substrate 100 and the gate structure 120. The substrate 100 may be dried to remove pure water from the substrate 100.

Figure 5:
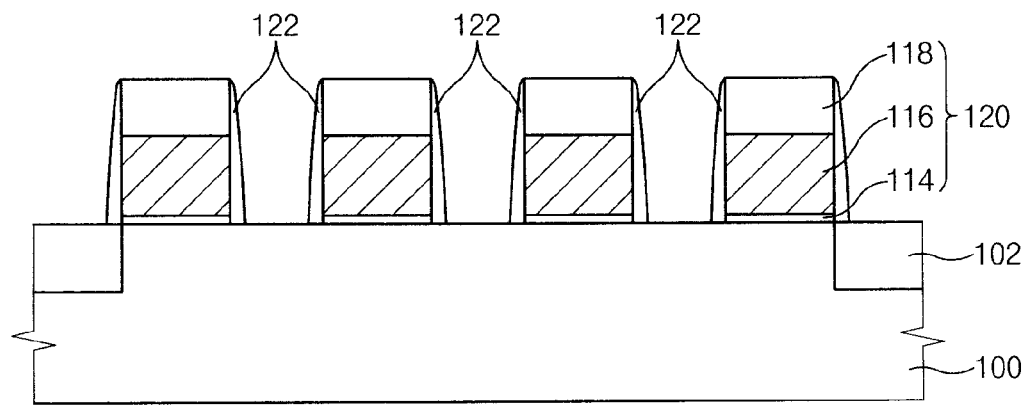

FIG. 5 is a cross-sectional view illustrating the formation of a spacer 122 on a sidewall of the gate structure 120. Referring to FIG. 5, an insulation layer may be formed on the gate structure from which the impurities may be removed in the cleaning process. The insulation layer may be anisotropically etched to form the spacer 122 on the sidewall of the gate structure 120. The gate structure 120, i.e., a word line, may be electrically separated from adjacent gate structure 120 by the spacer 122.

FIGS. 6 to 11 are cross-sectional views illustrating a method of forming a bit line in a semiconductor device using a cleaning composition in accordance with an embodiment.

Figure 6:
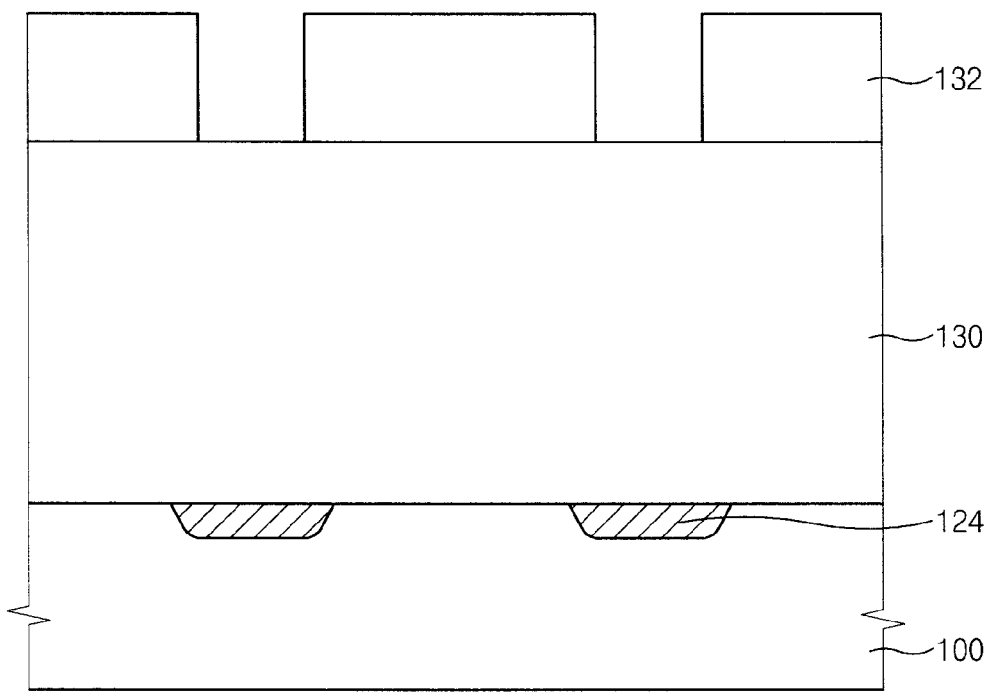

Referring to FIG. 6, the insulating interlayer 130 is formed on the substrate 100. A transistor (not shown) having the word line illustrated in FIG. 5 may be formed on the substrate 100. The first photoresist pattern 132 is formed on the insulating interlayer 130.

A source/drain 124 of the transistor may be formed by implanting impurities into selected portions of the substrate 100 exposed between the word lines using the word lines as masks and by thermally treating the substrate 100.

The insulating interlayer 130 is formed on the substrate 100 on which the transistor may be formed. The insulating interlayer 130 may be formed using an oxide, e.g., BPSG, PSG, USG, SOG, FOX, PE-TEOS and/or HDP-CVD oxide.

The first photoresist pattern 132 may be formed on the insulating interlayer 130. The first photoresist pattern 132 may have an opening which may define a contact region of the source/drain 124.

Figure 7:
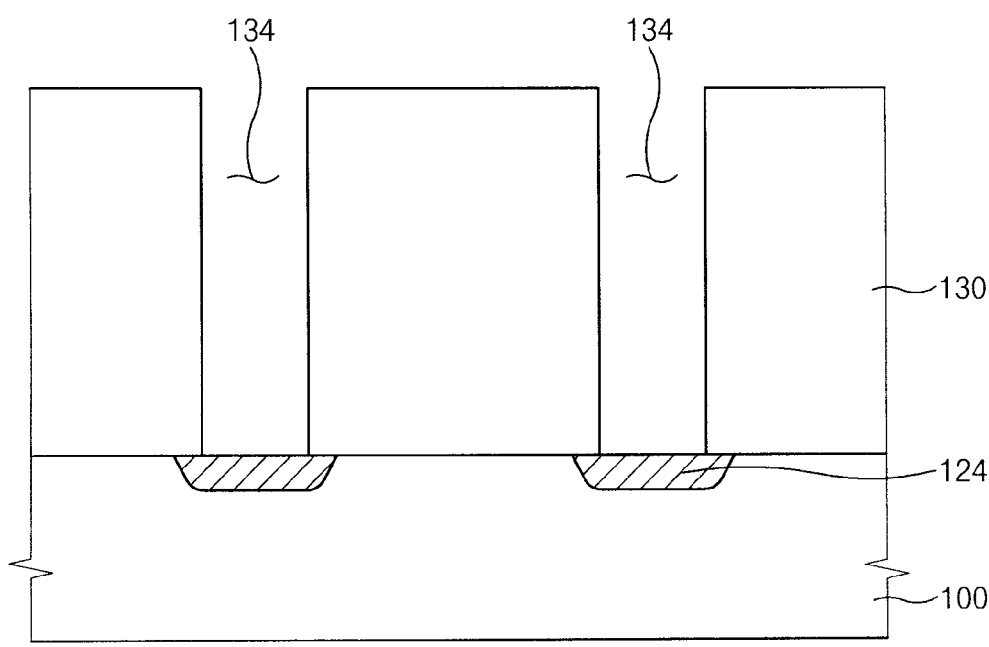

FIG. 7 is a cross-sectional view illustrating the formation of a contact hole 134 in the insulating interlayer 130. Referring to FIG. 7, the insulating interlayer 130 may be partially etched to form the contact hole 134 exposing the contact region 124. The insulating interlayer 130 may be anisotropically etched using the first photoresist pattern 132 as an etching mask. The first photoresist pattern 132 may be removed by an ashing process and/or a stripping process.

Figure 8:
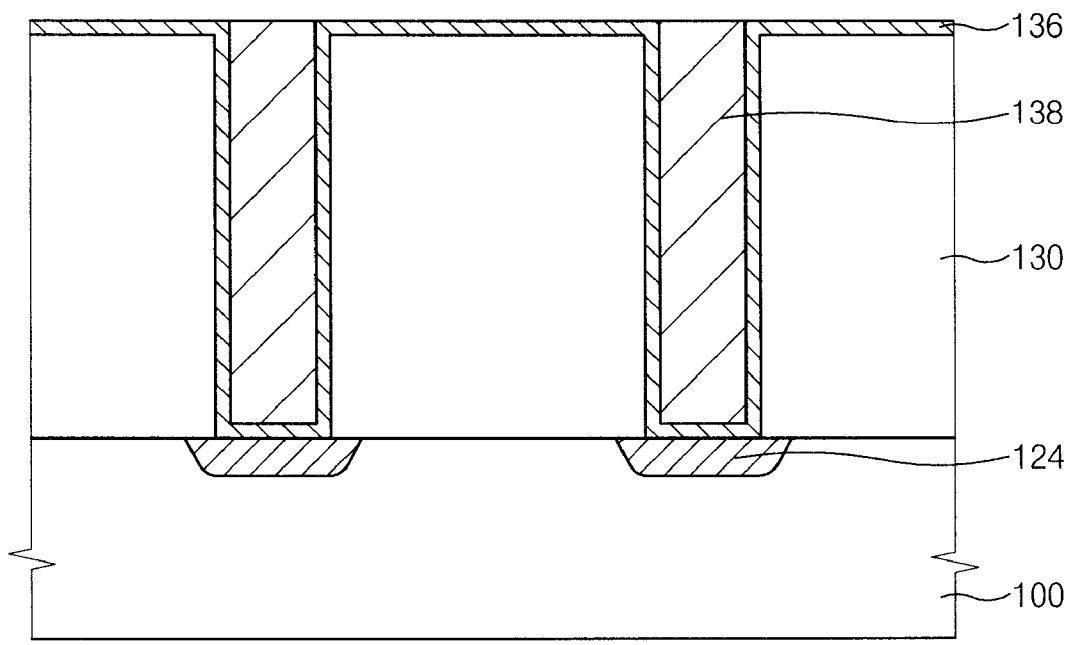

FIG. 8 is a cross-sectional view illustrating the formation of a barrier layer 136 on the insulating interlayer 130 including the contact hole 134. Referring to FIG. 8, the barrier layer 136 is formed on the insulating interlayer 130 and on a bottom and a sidewall of the contact hole 134. The barrier layer 136 serves to prevent a conductive material of a pad 138 successively formed from being diffused into the insulating interlayer 130. For example, the barrier layer 136 may be formed from titanium or titanium nitride. The contact hole 134 is then filled with a conductive material to form the pad 138 in the contact hole 134. The pad 138 contacts the contact region 124. Thus, the pad 138 is electrically connected to the contact region 124. The pad 138 may be formed from a metal such as tungsten or aluminum.

Figure 9:
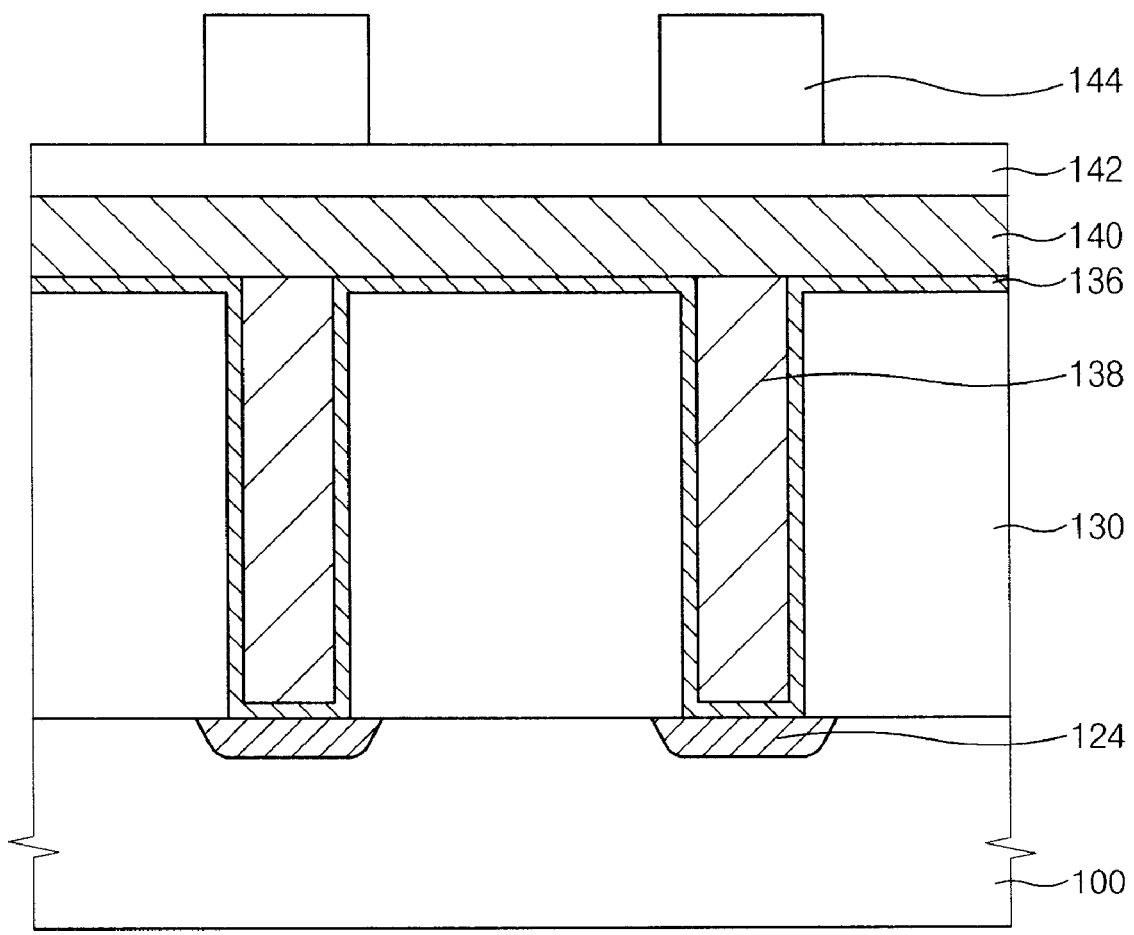

FIG. 9 is a cross-sectional view illustrating the formation of a conductive layer 140, a mask layer 142 and a second photoresist pattern 144 on the barrier layer 136 and the pad 138. Referring to FIG. 9, the conductive layer 140, the mask layer 142 and the second photoresist pattern 144 are sequentially formed on the barrier layer 136 and the pad 138. The conductive layer 140 may be formed using a metal or conductive metal nitride. For example, the conductive layer 140 may be formed using tungsten. The mask layer 142 may be formed using a nitride such as silicon nitride. The second photoresist pattern 144 may be used as an etching mask in an etching process for forming the bit line 154 (see FIG. 10).

Figure 10:
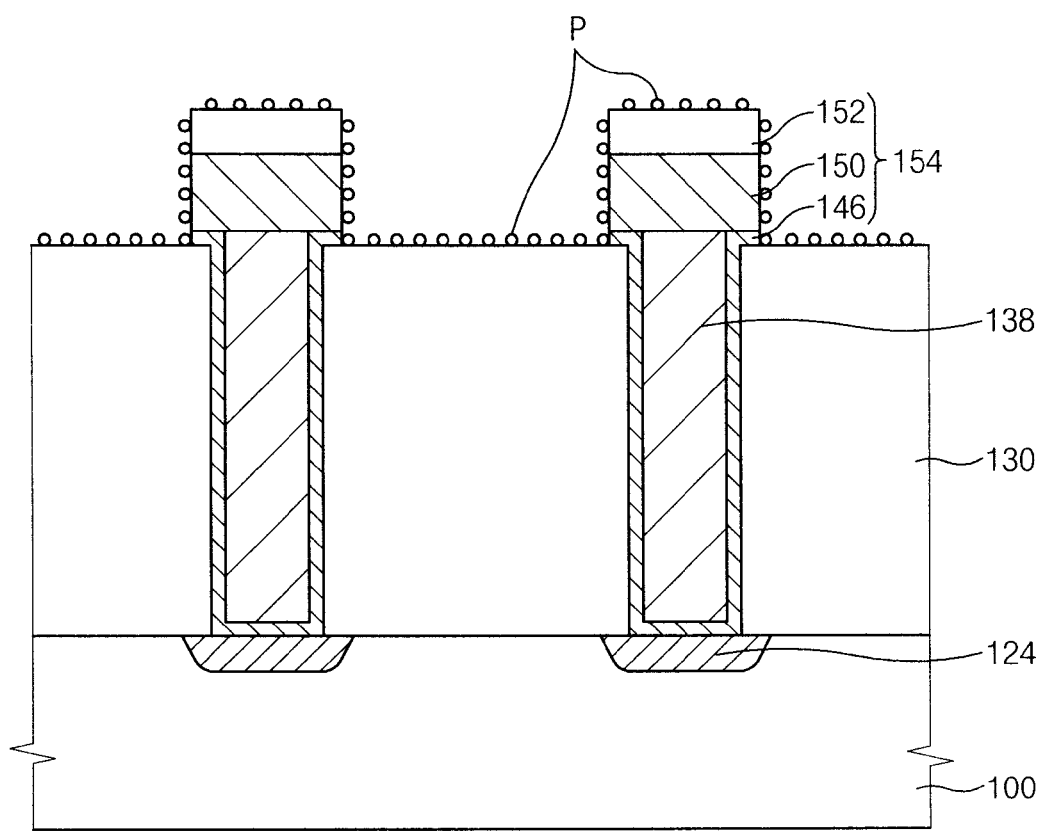

FIG. 10 is a cross-sectional view illustrating the formation of the bit line 154 on the pad 138. Referring to FIG. 10, an etching process may be performed to form the bit line 154 including a conductive layer pattern 150 and a mask pattern 152. The bit line 154 may be formed by sequentially dry etching the mask layer 142 and the conductive layer 140 using the second photoresist pattern 144 as an etching mask. The bit line 154 contacts the pad 138 to be electrically connected to the contact region 124. The second photoresist pattern 144 may be removed by an ashing process and/or a stripping process. Further, after performing the etching process for forming the bit line 154, a quantity of residual impurities (P) typically remains on the bit line 154 and/or the insulating interlayer 130. Examples of the impurities (P) may include organic impurities, oxide impurities and metallic impurities. Any residual impurities (P) remaining on the bit line 154 may raise an electrical resistance of the semiconductor device or generate an electrical short between adjacent bit lines. Therefore, removal of the residual impurities (P) is essential.

Figure 11:
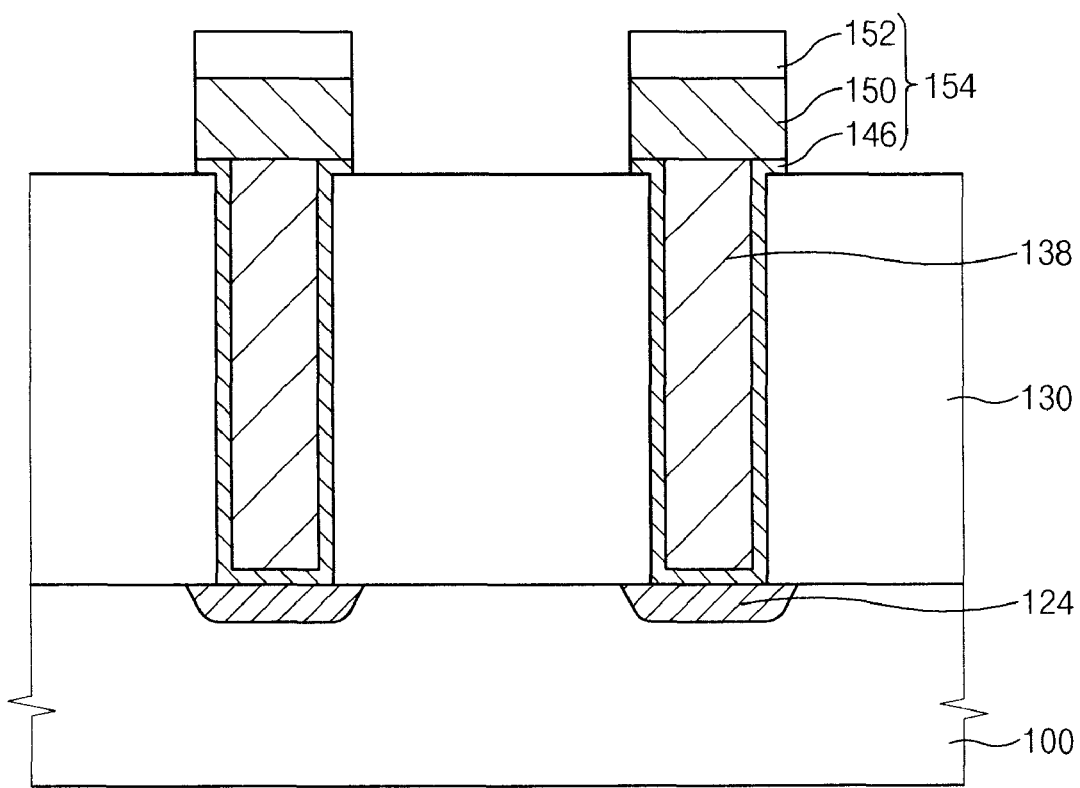

FIG. 11 is a cross-sectional view illustrating the removal of the residual impurities (P) from the bit line 154. Referring to FIG. 11, the residual impurities (P) are removed from the bit line 154 and the insulating interlayer 130 by performing a cleaning process using a cleaning composition according to an embodiment which does not damage the bit line 154 or the insulating interlayer 130.

The cleaning process may be performed by providing the substrate 100, on which the bit line 154 is formed, with a cleaning composition according to an embodiment. The cleaning composition may include about 0.5 to about 5% by weight of an organic ammonium hydroxide, about 0.1 to about 3% by weight of a fluoride compound, about 0.1 to about 3% by weight of a buffering agent, about 0.5 to about 5% by weight of an etching accelerant and a remainder of water. The cleaning composition may further include about 5 to about 100 ppm of a non-ionic surfactant. The cleaning composition and preparation thereof are previously described, so any further explanations will be omitted herein.

As previously described, the word line and/or the bit line are formed on a substrate using the cleaning composition in accordance with an embodiment Further, in other embodiments, metal wiring, pads, plugs, contacts, etc., may be formed using a cleaning composition and/or a cleaning method according to an embodiment.

Example embodiments will be further described hereinafter with reference to selected examples and related comparative examples for similar cleaning compositions and cleaning methods. These examples are illustrative and are not intended to be limiting of the scope of the present invention.

Examples 1 through 6 and Comparative Examples 1 to 3 are listed in Table 1 below. Cleaning compositions for removing residual impurities from a semiconductor substrate were prepared by mixing deionized water and other components as shown in Table 1. Cleaning methods using same were then performed to evaluate the removal abilities of the cleaning compositions and an etching rate of an exposed tungsten layer.

TABLE 1

|  | Alkylammonium Hydroxide | Fluoride | Buffering Agent | Etching accelerant | | | Surfactant | Acid Additive | Corrosion Inhibiting Agent | pH |
| --- | --- | --- | --- | --- | --- | --- | --- | --- | --- | --- |
|  |  |  |  | $NH_4F$ | $NH_4Br$ | $(NH_4)_2SO_4$ |  |  |  |  |
| Example 1 | 1% | 0.22% | 0.89% | 1.1% | — | — | 10 ppm | — | — | 4.5 |
| Example 2 | 1% | 0.24% | 0.89% | 1.1% | — | — | 10 ppm | — | — | 4.0 |
| Example 3 | 1% | 0.24% | 0.89% | — | 1.1% | — | 10 ppm | — | — | 4.0 |
| Example 4 | 1% | 0.24% | 0.89% | — | — | 1.1% | 10 ppm | — | — | 4.0 |
| Example 5 | 1% | 0.3% | 0.89% | 1.1% | — | — | 10 ppm | — | — | 3.5 |
| Example 6 | 1% | 0.24% | 0.89% | 1.5% | — | — | 10 ppm | — | — | 3.5 |
| Comparative | 1% | 0.22% | 0.89% | — | — | — | 10 ppm | — | 1.2% | 4.5 |

TABLE 1-continued

|  | Alkylammonium | | Buffering | Etching accelerant | | | | Acid | Corrosion Inhibiting | |
|---|---|---|---|---|---|---|---|---|---|---|
|  | Hydroxide | Fluoride | Agent | $NH_4F$ | $NH_4Br$ | $(NH_4)_2SO_4$ | Surfactant | Additive | Agent | pH |
| Example 1 Comparative Example 2 | 1% | 0.24% | 0.89% | — | — | — | 10 ppm | — | — | 4.5 |
| Comparative Example 3 | 1.8% | 0.01% | 0.40% | — | — | — | 10 ppm | 1.2% | — | 2.0 |

In Table 1, the alkylammonium hydroxide is tetramethylammonium hydroxide, the fluoride is hydrogen fluoride, the buffering agent is ammonium nitrate, the surfactant is polyalkylene alkyl ether, the acid additive is nitric acid, and the corrosion-inhibiting agent is buthanediol.

A cleaning method was performed on a semiconductor substrate using each of the cleaning compositions prepared in Examples 1 through 6 and Comparative Examples 1 through 3 to evaluate the removal abilities and etching rates of tungsten for the cleaning compositions.

To evaluate removal abilities of the cleaning compositions, silicon wafers contaminated by impurities or particles were prepared by immersing bare silicon wafers into a solution in which silicon nitride particles were dispersed. The contaminated silicon wafers had a surface on which about 4,000 silicon nitride particles having a diameter of at least about 0.16 μm were distributed. A cleaning process was performed on the contaminated silicon wafer using each of the cleaning compositions of Examples 1 through 6 and Comparative Examples 1 through 3. The cleaning process was carried out with a single wafer cleaning apparatus. The cleaning composition was spayed on the contaminated silicon wafer at a flow rate of about 1 L/min for about 60 seconds while the contaminated silicon wafer rotated with a speed of about 1,500 rpm. After applying the cleaning composition to the silicon wafer, the silicon wafer was rinsed using deionized water in a rotational condition of about 1,500 rpm for about 25 seconds. The silicon wafer was dried in a rotational condition of about 1,700 rpm for about 30 seconds. Before and after performing the cleaning process, the number of particles was estimated by counting the number of particles having a size of at least about 0.16 μm with a Surfscan particle inspection analyzer.

To evaluate an etching rate of a tungsten layer with respect to the cleaning compositions, a tungsten layer was formed on a silicon wafer on which a thermal oxide layer was formed. The tungsten layer was formed to have a thickness of about 500 Å. A cleaning process was carried out on the silicon wafer having the tungsten layer using each of the cleaning compositions. The cleaning process was substantially the same as the cleaning process for evaluating the removal abilities of the cleaning compositions. Before and after performing the cleaning process, the thickness of the tungsten layer was measured using Metapulse Equipment, an apparatus being capable of evaluating a thickness of a metal layer. The obtained results with respect to a removal ratio of particles and the etching rate of the tungsten layer are shown in Table 2.

TABLE 2

| Composition | Removal Ratio of Particles (%, >0.16 μm) | Etching Rate of Tungsten Layer [Å/min] |
|---|---|---|
| Comparative Example 1 | 60% | 11 |
| Comparative Example 2 | 65% | 10 |
| Comparative Example 3 | 20% | 8 |
| Example 1 | 69% | 6 |
| Example 2 | 86% | 3 |
| Example 3 | 73% | 10 |
| Example 4 | 75% | 9 |
| Example 5 | 76% | 13 |
| Example 6 | 80% | 7 |

As shown in Table 2, the cleaning compositions prepared in Comparative Examples 1 and 2 exhibited the etching rates of the tungsten layer as being about 11 Å/min and about 10 Å/min, and the removal ratios of impurities as being about 60% and about 65%, respectively. Accordingly, it may be noted that the cleaning composition having no ammonium salt (e.g., $NH_4F$, $NH_4Br$ and/or $(NH_4)_2SO_4$) may have a relatively low removal ratio and a relatively high etching rate of tungsten, and the cleaning composition may not satisfy cleaning criteria of a semiconductor manufacturing process, for example, a removal ratio of at least about 70% and an etching rate of tungsten lower than about 6 Å/min. Further, the cleaning composition of Comparative Example 3 was prepared by adding nitric acid, instead of the etching accelerant, to have a pH of about 2.0. The cleaning composition prepared in Comparative Example 3 showed the etching rate of the tungsten layer as being about 8 Å/min and the removal ratio of impurities as being about 20% which may be a very poor cleaning efficiency.

The cleaning composition of Example 1 was prepared to include ammonium fluoride ($NH_4F$) and to have a pH of about 4.5. The cleaning composition of Example 2 was prepared to include an increased amount of hydrogen fluoride as compared with the cleaning composition of Example 1 and to have a pH of about 4.0. It may be noted that a removal ratio of impurities may increase as the amount of hydrogen fluoride increases. When the cleaning compositions prepared in Example 2 to 4 and Comparative Example 2 are compared with each other, it may be noted that an ammonium salt such as ammonium fluoride ($NH_4F$), ammonium bromide ($NH_4Br$) or ammonium sulfate (($NH_4)_2(SO_4)$) may improve the removal ratio of impurities. When the cleaning compositions prepared in Example 2 and Comparative Example 2 are compared with each other, it may be confirmed that ammonium fluoride ($NH_4F$) may increase the removal ratio of impurities and finely etch the tungsten layer with a reduced etching rate. Further, in an additional experiment, it was confirmed that adding ammonium fluoride ($NH_4F$) decreased an etching rate of a silicon oxide layer. Accordingly, it may be noted that a cleaning composition including both hydrogen fluoride and an inorganic ammonium salt may have an enhanced ability to remove impurities, and may an improved etching selectivity between the tungsten layer and the silicon oxide layer, because the cleaning composition may finely etch the tungsten layer and suppress a silicon oxide layer.

The cleaning compositions prepared in Examples 2 through 4 were prepared to include different three types of the inorganic ammonium salts, i.e., $NH_4F$, $NH_4Br$ and $(NH_4)_2(SO_4)$, respectively. The three cleaning compositions had a pH of about 4.0. When these cleaning compositions were compared with each other, the cleaning composition having $NH_4F$ exhibited a better ability to remove impurities and a smaller etching rate of the tungsten layer than those of the cleaning compositions including $NH_4Br$ or $(NH_4)_2(SO_4)$. The cleaning composition of Example 5 was prepared by increasing the amount of HF in the cleaning composition of Example 2. The cleaning composition of Example 6 was prepared by increasing the amount of $NH_4F$ in the cleaning composition of Example 2. When the cleaning compositions prepared in Example 2, 5 and 6 were compared with each other, the cleaning composition of Example 2 showed an improved removal ratio of impurities and a reduced etching rate of the tungsten layer.

Therefore, it may be noted that the cleaning compositions prepared in Examples may effectively remove impurities from a substrate and/or a metal layer and also reduce or suppress damage to the metal layer in a semiconductor manufacturing process, e.g., a metal line forming process.

According to embodiments, a cleaning composition comprises about 0.5 to about 5% by weight of the etching accelerant. The cleaning composition removes several types of impurities from a substrate in a single wafer cleaning process, suppresses re-adsorption of the impurities to the substrate, and also prevents damage to a conductive element, as compared with a conventional organic cleaning solution. Accordingly, a method of cleaning a substrate using the cleaning composition may be employed to rapidly remove residual impurities from a substrate on which a conductive element has previously been formed.

The foregoing is illustrative of example embodiments and is not to be construed as limiting thereof. Although embodiments have been described, those skilled in the art will readily appreciate that many modifications are possible in the embodiments without materially departing from the scope of the invention. Accordingly, all such modifications are intended to be included within the scope of the present invention as defined in the following claims. Therefore, it may be understood that the foregoing description is illustrative of various embodiments and is not to be construed as limited to the specific example embodiments disclosed, and that modifications to the disclosed example embodiments, as well as other example embodiments, are intended to be included within the scope of the appended claims.

What is claimed is:

1. A method of cleaning a semiconductor substrate, comprising:
preparing a cleaning composition to include about 0.5 to about 5% by weight of an organic ammonium hydroxide compound, about 0.1 to about 3% by weight of a fluoride compound, about 0.1 to about 3% by weight of a buffering agent, about 0.5 to about 5% by weight of an etching accelerant, and a remainder of water; and thereafter,
applying the cleaning composition to a semiconductor substrate having a conductive element previously formed thereon using a single-wafer cleaning process, wherein the cleaning composition is applied as the semiconductor substrate rotates at a speed of about 1,000 to about 2,000 rpm.

2. The method of claim 1, wherein the cleaning composition is applied using the single-wafer cleaning apparatus for about 30 to about 90 seconds.

3. The method of claim 1, wherein the cleaning composition further comprises a surfactant in an amount ranging from about 5 ppm to about 100 ppm.

4. A method of manufacturing a semiconductor device, comprising:
forming a conductive element from a metal material on a substrate; and thereafter,
removing residual impurities from the substrate and the conductive element using a single-wafer cleaning process and a cleaning composition that comprises about 0.5 to about 5% by weight of an organic ammonium hydroxide compound, about 0.1 to about 3% by weight of a fluoride compound, about 0.1 to about 3% by weight of a buffering agent, wherein the buffering agent comprises at least one of ammonium nitrate and ammonium iodate, about 0.5 to about 5% by weight of an etching accelerant, and a remainder of water, the impurities being generated while the conductive element is formed on the substrate.

5. The method of claim 4, wherein the conductive element comprises at least one of a gate electrode, a bit line, a pad, a contact, and a metal wiring.

6. The method of claim 4, further comprising:
rinsing the substrate after removing the residual impurities; and thereafter, drying the substrate.

7. The method of claim 4, wherein the cleaning composition further comprises a surfactant in an amount ranging from about 5 ppm to about 100 ppm.

8. The method of claim 4, wherein the etching accelerant comprises ammonium fluoride ($NH_4F$).

9. The method of claim 4, wherein the cleaning composition has a pH in a range of about 3.5 to about 4.5.

10. The method of claim 1, wherein the etching accelerant comprises at least one selected from the group consisting of ammonium fluoride ($NH_4F$), ammonium bromide ($NH_4Br$) and ammonium sulfate (($NH_4)_2SO_4$).

11. The method of claim 10, wherein the etching accelerant comprises ammonium fluoride ($NH_4F$).

12. The method of claim 1, wherein the organic ammonium hydroxide compound comprises at least one selected from the group consisting of tetramethylammonium hydroxide, tetraethylammonium hydroxide, tetrapropylammonium hydroxide, tetrabutylammonium hydroxide, tetrahexylammonium hydroxide, tetraoctylammonium hydroxide, benzyltriethylammonium hydroxide, diethyldimethylammonium hydroxide, hexadecyltrimethylammonium hydroxide, and methyltributylammonium hydroxide.

13. The method of claim 1, wherein the fluoride compound comprises at least one selected from the group consisting of hydrogen fluoride, tetramethylammonium fluoride, tetraethylammonium fluoride, tetrapropylammonium fluoride, tetrabutylammonium fluoride, fluoroboric acid, tetramethylammonium tetrafluoroborate, tetraethylammonium tetrafluoroborate, tetrapropylammonium tetrafluoroborate, and tetrabutylammonium tetrafluoroborate.

14. A method of cleaning a semiconductor substrate, comprising:
preparing a cleaning composition to include about 0.5 to about 5% by weight of an organic ammonium hydroxide compound, about 0.1 to about 3% by weight of a fluoride compound, about 0.1 to about 3% by weight of a buffering agent, wherein the buffering agent comprises at least one of ammonium nitrate and ammonium iodate, about 0.5 to about 5% by weight of an etching accelerant, and a remainder of water; and thereafter, applying the cleaning composition to a semiconductor substrate having a conductive element previously formed thereon using a single-wafer cleaning process.

15. The method of claim 14, wherein the cleaning composition comprises:
about 0.5 to about 3% by weight of the organic ammonium hydroxide compound;
about 0.1 to about 1% by weight of the fluoride compound;
about 0.4 to about 1.5% by weight of the buffering agent;
about 0.5 to about 2% by weight of the etching accelerant;
about 5 to about 50 ppm of a non-ionic surfactant; and
a remainder of water.

16. The method of claim 14, wherein the cleaning composition has a pH in a range of about 2.0 to about 4.5.

17. The method of claim 14, wherein the cleaning composition has a pH in a range of about 3.5 to about 4.5.

18. The method of claim 14, wherein the cleaning composition is applied using the single-wafer cleaning apparatus for about 30 to about 90 seconds.

19. The method of claim 14, wherein the cleaning composition further comprises a surfactant in an amount ranging from about 5 ppm to about 100 ppm.

20. The method of claim 14, wherein the etching accelerant comprises ammonium fluoride ($NH_4F$).

* * * * *